United States Patent
Hoo et al.

(10) Patent No.: US 6,768,316 B2
(45) Date of Patent: Jul. 27, 2004

(54) LASER CUTTING OF LAMINATES FOR ELECTRICAL INSULATION TESTING

(75) Inventors: Yeo Kong Hoo, Singapore (SG); Christopher Vernon Smith, Henniker, NH (US)

(73) Assignee: Polyclad Laminates, Inc., Franklin, NH (US)

( * ) Notice: Subject to any disclaimer, the term of this patent is extended or adjusted under 35 U.S.C. 154(b) by 0 days.

(21) Appl. No.: 10/316,665

(22) Filed: Dec. 11, 2002

(65) Prior Publication Data

US 2004/0115405 A1 Jun. 17, 2004

(51) Int. Cl.[7] ............ G01N 27/00; H05K 3/02; H01R 12/04; B23K 26/38
(52) U.S. Cl. ............ 324/557; 324/537; 29/847; 219/121.69
(58) Field of Search .......... 29/847, 846; 428/192, 428/209; 174/250, 255, 258, 261; 324/557, 554, 551, 537; 219/121.72, 121.67, 121.69

(56) References Cited

U.S. PATENT DOCUMENTS

| | | | | |
|---|---|---|---|---|
| 4,284,970 A | * | 8/1981 | Berrin et al. ............ 338/195 |
| 4,527,041 A | * | 7/1985 | Kai ............ 219/121.72 |
| 5,594,349 A | * | 1/1997 | Kimura ............ 324/551 |
| 6,114,015 A | * | 9/2000 | Fillion et al. ............ 428/192 |
| 6,553,661 B2 | * | 4/2003 | Arnold et al. ............ 29/847 |
| 6,621,290 B1 | * | 9/2003 | Wang et al. ............ 324/766 |

FOREIGN PATENT DOCUMENTS

JP 5229059 9/1993

OTHER PUBLICATIONS

Coombs (Editor) *Printed Circuits Handbook*, 4th Ed., 22.4–22.11 (1995).

* cited by examiner

Primary Examiner—Anjan K. Deb
(74) Attorney, Agent, or Firm—Mintz, Levin, Cohn, Ferris, Glovsky and Popeo, P.C.

(57) ABSTRACT

A laminate comprising an insulation layer sandwiched between a pair of electrically conductive layers is prepared for electrical insulation testing by using a laser to remove a strip from at least one of the conductive layers proximate the edge of the laminate to electrically isolate a central, bulk portion of the conductive layer from the edges of the laminate. Conductive material that may be smeared across an edge of the laminate will not therefore provide an electrical short between the portion of the conductive layer surrounded by the slot and the second conductive layer on the opposite side of the insulation layer.

9 Claims, 2 Drawing Sheets

LASER CUTTING OF LAMINATES FOR ELECTRICAL INSULATION TESTING

BACKGROUND

In its simplest form, a copper-clad electrical-grade laminate includes, as a component, one or more dielectric layers of woven or non-woven glass fiber impregnated with epoxy or other polymer resin; the composite is known in the art as "prepreg." The prepreg is sandwiched between sheets of metal foil (typically formed of copper) and pressed at elevated temperature and pressure to form a laminate sheet.

These laminates are generally manufactured in bulk and stacked one upon another. The assembly of component layers for one laminate is referred to as a press layup, and the stack of layups is known as a book. The layups are separated (typically, with a metallic separator); heated; and then subjected to pressure. After curing and cooling, the then-bonded individual laminates are separated from one another and subjected to further processing en route to producing a printed circuit board (also known as a "printed wiring board").

Specifically, a printed circuit board can be formed from a single laminate with external etched wiring patterns; or a plurality of laminates with etched patterns can be stacked and bonded to produce a multi-layer printed circuit board.

Traditionally, printed circuit boards were made from laminates having insulation layers with a thickness of about 1.5 mm or more. However, printed circuit boards comprising insulation layers of less than about 0.15 mm thickness are now in use. The laminates used to produce these thinner printed circuit boards are referred to as "thin laminates" or "thin-laminate panels."

In traditional laminates, electrical shorting across separated conductive layers is rarely a problem due to the substantial thickness of the insulation layer. In "thin laminates," however, electrical shorts through the insulation layer may exist as a consequence of impurities in the insulation layer. If an electrical short exists across the layers, the laminate is defective and unsuitable for producing a printed circuit board, and the identification and removal of such a defective laminate (before additional processing) can produce substantial savings of time and resources. The potential for these defects typically increases as laminate thickness decreases.

Laminates can be subjected to a high-potential (Hipot) test to detect shorts between the conductive layers. However, electrical shorts may also exist at the edges of laminates created by the smearing of conductive material across the edge of the laminate when the laminate panel is fabricated from a larger laminate structure, thereby forming a conductive link between the conductive layers across the edge of the laminate. The smeared conductive material, however, is typically readily removed from the edge of the laminate during subsequent processing. Accordingly, a laminate with a short only on an edge surface need not be considered defective and may still be readily usable in producing a printed circuit board.

The Hipot test, however, simply measures the ohmic resistance between conductive layers; if a low resistance (produced, e.g., by an electrical short) is detected; however, the source of that low resistance is not identified. Accordingly, a laminate with an internal defect in the insulation layer is not readily distinguishable from a laminate that has a short on one of its edges; and both are consequently tagged as being "defective." In some cases, testing of the laminates may be forsaken in view of this inability to distinguish these different types of electrical shorts.

In other cases, known methods may be used to attempt to remove conductive material from an edge of the laminate to thereby remedy this potential source of shorts. For example, in published Japanese Patent Application 05-229059A (Hitachi Chemical Co.), a router is used to trim the edges of a thin laminate to prevent formation of electrical shorts produced by conductive material extending across an edge of the laminate, thereby improving the reliability with which the laminates can be tested for electrical reliability.

Likewise, U.S. Pat. No. 6,114,015, issued to Fillion et al., describes a similar procedure intended to remove shorts formed by conductive material spread across the edges of laminates by using a router to trim the edges of the laminate such that the laminate can be electrically tested without receiving "false negatives" produced by an electrical short at an edge of the laminate.

SUMMARY

The apparatus and methods, described below, build upon the above-described subject matter and provide a new method for remedying electrical shorts across edges of laminates to enable accurate testing of the laminates for electrical defects. Specifically, a laser is directed along a path proximate one or more edges of an outer surface of a conductive layer of the laminate. The laser removes a strip from the conductive layer to electrically isolate a central, bulk portion of the conductive layer from the edges of the laminate.

The strip can be cut immediately adjacent the edges of the conductive layer or merely proximate the edges such that conductive material may remain adjacent the edge; though, the remaining conductive material near the edge will be electrically isolated from the remaining bulk of the conductive layer. These methods can be used either on large laminate sheets or on smaller panels. These methods are particularly advantageous for use with laminates wherein the insulation layer has a thickness of about 0.25 mm or less. These thin laminates are electrically tested by measuring current flow (e.g., measuring voltage or resistance) between conductive layers separated by an insulating layer in the laminate.

Figure 1:
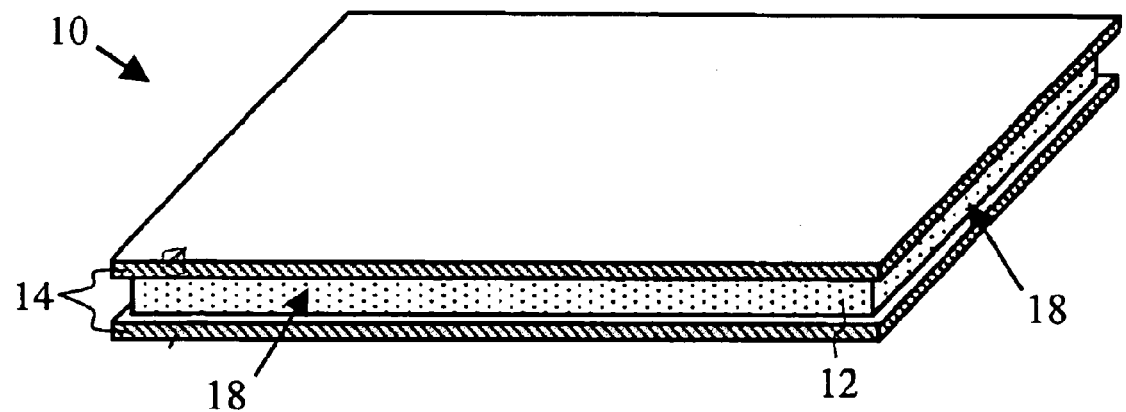
FIG. 1 is a perspective view of an untrimmed laminate.

The foregoing and other features and advantages of the invention will be apparent from the detailed description that follows. In the accompanying drawings, like reference characters refer to the same or similar parts throughout the different views. The drawings are not necessarily to scale, emphasis instead being placed upon illustrating particular principles, discussed below.

DETAILED DESCRIPTION

A simple uncut laminate 10 comprising an insulation layer 12 sandwiched between a pair of conductive layers 14 is illustrated in FIG. 1. The laminate 10 is formed by inserting separator sheets above and below the three-layer structure. A plurality of these structures, separated by separator sheets can be stacked to form a book; and the book can then be laminated in a curing press. Optionally, the laminate 10 can include additional, alternating insulation and conductive layers 12 and 14 to form a multi-layer structure having three or more conductive layers 14.

The conductive layers 14 can be in the form of foil, such as, but not limited to, electrodeposited types described as DSTF™ (drum side treated foil), DT (double treat), standard (shiny), as well as others known to those skilled in the art. Alternatively, rolled annealed foil can be used. The conductive layer 14 can be formed of copper. Other conductive materials such as aluminum, silver and/or gold can also be used. The thickness of each of the conductive layers 14 can be in the range of about 0.0025 mm to about 0.25 mm. In a particular embodiment, the conductive-layer thickness is about 0.04 mm.

The insulation layers 12 can be in the form of a plastic film, comprising, e.g., acrylics or polyimides (e.g., KAPTON from DuPont of Wilmington, Del., USA). The insulation layer can also be in the form of a reinforcement impregnated with a resin. The reinforcement can be a woven or non-woven fiberglass, quartz, cellulose, paper, and/or aromatic polyamide fibers (e.g., KEVLAR or THERMOUNT from DuPont). The resin can include a thermoplastic resin and/or a thermoset resin. In specific embodiments, the resin is an epoxy resin, a polyimide resin, polyphenylene ether or an epoxy resin blended with one or more additional resins. Though, other resins may also be used, and new suitable resins may be developed.

Each of the insulation layers 12 can have a thickness in the range of about 0.01 mm to about 0.25 mm. In particular embodiments, the thickness of the insulating layer 12 is in the range of about 0.025 mm to about 0.15 mm. And in one specific embodiment, the thickness of the insulating layer 12 is about 0.05 mm.

The insulation layer can also include a filler. The filler can serve as a flame retardant, or it can serve to reduce the cost of the laminate or to alter other laminate properties, such as increasing its capacitance. In one embodiment, the filler is in the form of barium titanate particulates.

The conductive layers 14 are advantageously 0.013 mm to 0.064 mm (0.0005 to 0.0025 inches); typically, this range is expressed as 0.5 to 2 ounces per square foot. More broadly, the range of thickness for the copper sheets can be 0.005 mm to 0.30 mm (0.0002 to 0.012 inches or 0.25 to 10 ounces per square foot).

The conductive layers 14 can be obtained from numerous suppliers in the marketplace. Copper foils, such as 1 oz DSTF™, THE may be obtained from Gould Electronics, Eastlake, Ohio, U.S.A.; Cookson-Fukuda Ltd., United Kingdom; and Oak Mitsui, Hoosick Falls, N.Y., U.S.A. The separator sheets separating the conductive layers 14 of stacked laminates 10 can be formed, e.g., of steel or aluminum, In one embodiment, the planar dimensions of the insulation layer 12 are 38 inches by 50 inches (0.97 m by 1.27 m), and the planar dimensions of the conductive layers 14 are 39 inches by 51 inches (0.99 m by 1.30 m), providing about a half-inch of overhanging conductive layer (referred to as "flash") at the edges.

The three-layer structures are then stacked and pressed in a curing press at, e.g., 300–450° F. (about 150 to about 250° C.), thereby bonding the conductive layers with the insulation layers. After pressing, the laminates 10 are transferred to a cutting apparatus, such as a paneling saw or a router. The cutting apparatus can be used to trim the edges 18 of the laminates 10 to produce laminates having final customer dimensions, e.g., 3 feet by 4 feet (about 0.9 m by about 1.2 m). Optionally, the cutting apparatus can be used to further divide the laminates 10 into smaller panels.

When the edges 18 of the laminate 10 are cut or sheared, one or more of the conductive layers 14 may be smeared across the edge of the laminate to form a conductive link or short 20 between the conductive layers 14, across an edge 18 of the insulating layer 12. As noted above, the presence of the conductive material at the conductive link 20 will result in a low resistance between the conductive layers 14, which will cause the laminate 10 to fail electrical testing if this conductive pathway is not broken.

Figure 2:
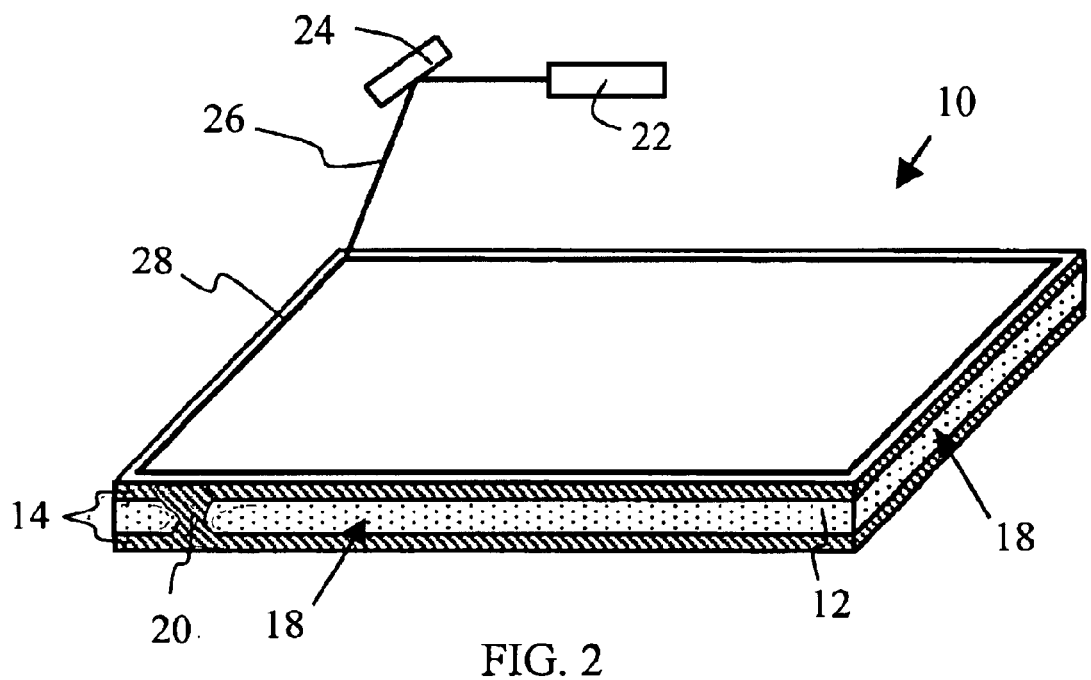
FIG. 2 illustrates the use of a laser to cut a strip from a conductive layer on a laminate to electrically isolate an electrical short at an edge of the laminate.

As illustrated in FIG. 2, a laser 22 is provided to break the conductive coupling provided by the link 20 and continuously extending across the bulk of both conductive layers 14. One example of a suitable laser is a Coherent Avia ultra-violet triple YAG 3-watt laser with a 35-micron beam. The laser 22 can be operated at a pulse rate ranging from 22 kHz at peak power and at a beam pass rate of 200–1200 mm/minute, with 1 to 8 passes of the beam 26 across a path on the surface of the conductive layer 14.

In one embodiment, a galvanometer scanner 24 (i.e., a rotating mirror assembly) is mounted in a LVD 2001 DP drilling system from Excellon (Torrence, Calif., USA); the galvanometer scanner 24 directs the beam 26 produced by the laser 22 along a path proximate the edges of the conductive layer 14. Alternatively, a moving XY table can be used to control the movement of the laser 22 to produce the desired path. In one embodiment, the path is about 0.25 to about 0.5 mm (10–20 mils) from the edge 18 of the laminate 10.

Figure 3:
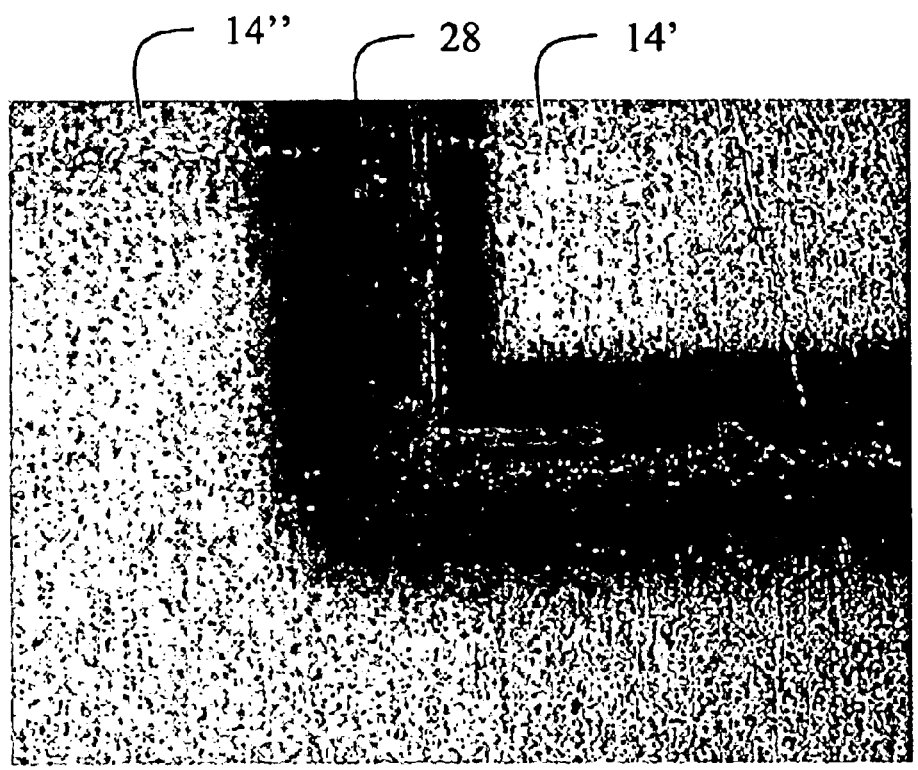
FIG. 3 is a magnified image of a strip cut from a conductive layer on a laminate to produce a slot in the conductive layer.
Figure 4:
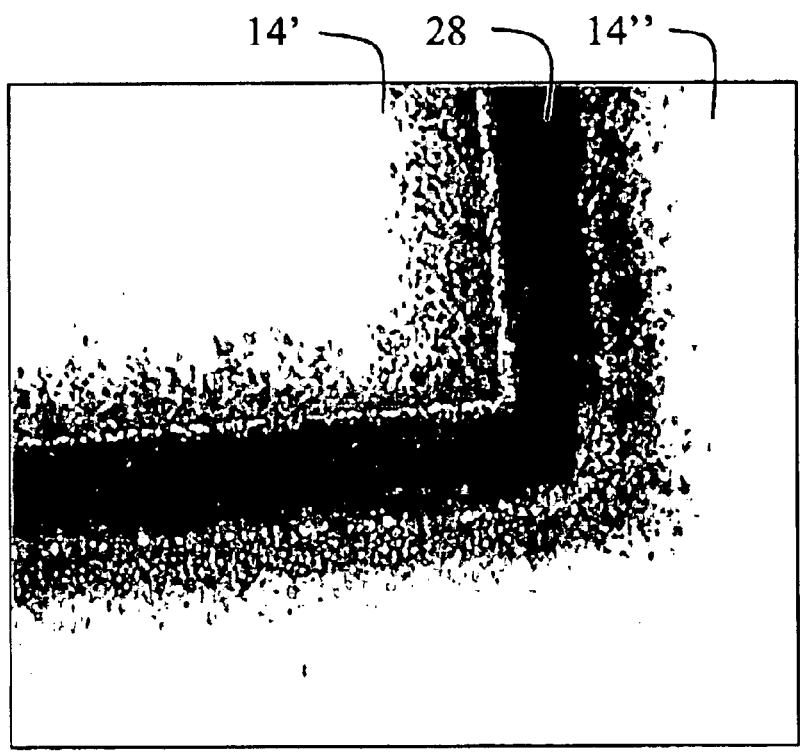
FIG. 4 is another magnified image of a strip cut from a conductive layer on a laminate.

The laser beam 26 thereby cuts a strip to produce a slot 28 (or furrow) in one of the conductive layers 14 along the path traced by the beam 26. This slot 28 produces a gap in the conductive layer 14 that electrically isolates the conductive material in the bulk, central region of the conductive layer 14 from the edges 18 of the laminate 10. Images of slots 28 cut in the conductive layer of a laminate via this equipment are provided in FIGS. 3 and 4. In the images, the gap between the portion 14' of the conductive layer surrounded by the slot 28 and the portion 14" outside the slot 28 (extending to the perimeter of the laminate) is clearly evident.

Alternatively, the laser beam 26 can be directed onto or immediately adjacent to the edges of the laminate to remove a strip at the periphery of the conductive layer and thereby expose a strip on the insulation layer at its periphery to thereby prevent electric current flow between the conductive layers 14 across the insulating layer 12.

After the laminate 10 is cut and, optionally, cleaned, the laminate 10 can be tested for electrical defects (e.g., the existence of electrical shorts between conductive layers 14) via a standard resistance test, such as a high-potential (Hipot) test using a megohm meter (such as an HMA3A megohm meter from Hipotronics of Brewster, N.Y., USA). The megohm meter is electrically coupled with the conductive layers 14 on opposite sides of the insulating layer 12. A relatively high voltage is then applied to a first conductive layer, and a corresponding voltage is measured at the second conductive layer. If the laminate 10 is defective (i.e., if an electrical short exists between the two conductive layers 14), electric current flows between the conductive layers 14, and a corresponding voltage is detected at the second conductive layer.

Where a laminate 10 is free of electrical shorts between the conductive layers 14, the resistance detected at the second conductive layer is very high (e.g. 10 gigaohms); specifications for laminate failure may be set at a resistance of 1 gigaohm, where any laminate having an interlayer resistance below 1 gigaohm is labeled, defective. If the laminate 10 passes the test (i.e., exhibits a resistance across the layers above the specified limit), the laminate 10 can be subjected to further processing (e.g., etching circuits from the conductive layer en route to producing a printed circuit board). In one embodiment, a full-size laminate panel 10 is cut with the laser, as described above; in an alternative embodiment, the laminate 10 is first cut into smaller panels, and the laser is then used to cut a strip from a conductive layer of the smaller panel at or near the periphery of the conductive layer, as described above.

While this invention has been shown and described with references to particular embodiments thereof, those skilled in the art will understand that various changes in form and details may be made therein without departing from the scope of the invention, which is limited only by the following claims. For example, while much of the description, above, is particularly directed to much of the three-layer laminate panels, the methods can likewise be performed on multi-layer laminates with three or more conductive layers separated by insulation layers.

What is claimed is:

1. A method for preparing a laminate for electrical insulation testing, the method comprising:

providing a laminate comprising an insulation layer sandwiched between a pair of conductive layers comprising electrically conductive material, wherein at least one of the conductive layers has a pair of surfaces facing opposite directions, one of the surfaces being bonded to the insulation layer and the other surface being exposed;

directing a laser beam along a path on the exposed surface of the conductive layer, wherein the path is proximate one or more edges of the exposed surface, the laser beam removing a strip from the conductive layer to expose a strip on a surface of the insulation layer, wherein the exposed strip on the insulation layer surrounds and electrically isolates a remaining central portion of the conductive layer from the edge of the laminate; then testing the resistance to electrical current between the conductive layers; and then, if the resistance is above a specified limit, forming wiring patterns by selectively removing additional conductive material from the conductive layer onto which the laser beam was directed.

2. The method of claim 1, wherein the edges of the laminate are trimmed before the laser beam is directed onto the conductive layer.

3. The method of claim 1, wherein the insulation layer is a resin-impregnated reinforced prepreg cloth.

4. The method of claim 3, wherein the resin is selected from the group consisting of an epoxy, a polyimide, polyphenylene ether, or an epoxy blend.

5. The method of claim 1, wherein the conductive layers comprise one or more materials selected from the group consisting of copper, aluminum, silver, gold, and mixtures thereof.

6. The method of claim 1, wherein the insulation layer has a thickness of about 0.25 mm or less.

7. The method of claim 6, wherein the insulation layer has a thickness between 0.01 mm and 0.2 mm.

8. The method of claim 6, wherein the conductive layers have thicknesses in the range from about 0.005 mm to about 0.07 mm.

9. The method of claim 1, wherein the strip surrounds an interior region of the conductive layer and segregates the interior region from remaining portions of the conductive layer on the surface of the insulation layer adjacent the edge of the insulation layer.

* * * * *